(12) United States Patent
Liang et al.

(10) Patent No.: US 9,475,192 B2
(45) Date of Patent: Oct. 25, 2016

(54) SIMULATION DEVICE FOR PLURAL ROBOTS

(71) Applicant: FANUC CORPORATION, Minamitsuru-gun, Yamanashi (JP)

(72) Inventors: Yanxue Liang, Yamanashi (JP); Yoshiharu Nagatsuka, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 14/686,925

(22) Filed: Apr. 15, 2015

(65) Prior Publication Data

US 2015/0306768 A1 Oct. 29, 2015

(30) Foreign Application Priority Data

Apr. 25, 2014 (JP) .................................. 2014-091956

(51) Int. Cl.
  G06G 7/48 (2006.01)
  B25J 9/16 (2006.01)
  G06F 17/50 (2006.01)
  G05B 19/406 (2006.01)

(52) U.S. Cl.
  CPC ............ *B25J 9/1671* (2013.01); *G05B 19/406* (2013.01); *G06F 17/5009* (2013.01); *G05B 2219/37209* (2013.01); *Y10S 901/02* (2013.01)

(58) Field of Classification Search
  CPC ...... B25J 9/1674; B25J 9/167; B25J 9/1671; B25J 5/007; B25J 9/1633; G05B 19/402; B05B 13/0431; G05D 1/0033
  See application file for complete search history.

(56) References Cited

U.S. PATENT DOCUMENTS

| 8,639,364 B2 | 1/2014 | Stoddard | |
| 2007/0021868 A1* | 1/2007 | Nagatsuka | B25J 9/1674 700/245 |
| 2010/0121489 A1* | 5/2010 | Inazumi | G05B 19/402 700/255 |
| 2010/0305751 A1* | 12/2010 | Nagatsuka | B25J 9/1671 700/245 |
| 2011/0106339 A1* | 5/2011 | Phillips | G05D 1/0033 701/2 |
| 2013/0282176 A1 | 10/2013 | Lapham | |
| 2014/0009561 A1* | 1/2014 | Sutherland | B25J 5/007 348/14.05 |
| 2014/0012419 A1* | 1/2014 | Nakajima | B25J 9/1633 700/261 |
| 2014/0052294 A1* | 2/2014 | Herre | B05B 13/0431 700/248 |

FOREIGN PATENT DOCUMENTS

| CN | 1903523 | 1/2007 |
| CN | 1982001 | 6/2007 |
| CN | 101085523 | 12/2007 |
| CN | 102658550 | 9/2012 |
| DE | 19625637 | 1/1998 |
| DE | 102010052253 | 5/2012 |

(Continued)

*Primary Examiner* — Kandasmy Thangavelu
(74) *Attorney, Agent, or Firm* — RatnerPrestia

(57) ABSTRACT

A simulation device includes a simulation unit which executes, by simulation, a motion program containing a command velocity and a command acceleration of the drive shaft, and a motion waiting instruction, a storage unit which stores in time series a line number of the motion program and the command velocity and the command acceleration at the line number associated with one another; an execution time calculation unit which calculates the execution time of the motion program for each of the line numbers stored in the storage unit based on a simulation result; and a waiting time calculation unit which calculates the motion waiting time in accordance with the motion waiting instruction based on the execution time calculated by the execution time calculation unit.

4 Claims, 10 Drawing Sheets

(56) References Cited

FOREIGN PATENT DOCUMENTS

| JP | 2003103491 | 4/2003 |
| JP | 2007011680 | 1/2007 |
| JP | 2007-054942 | 3/2007 |
| JP | 2007136671 | 6/2007 |
| JP | 2009190113 | 8/2009 |
| JP | 2011-005623 | 1/2011 |

* cited by examiner

MOTION INSTRUCTION 0
MOTION WAITING INSTRUCTION 1
MOTION INSTRUCTION 1
MOTION INSTRUCTION 2

⋮

MOTION INSTRUCTION N
MOTION WAITING INSTRUCTION 2

⋮

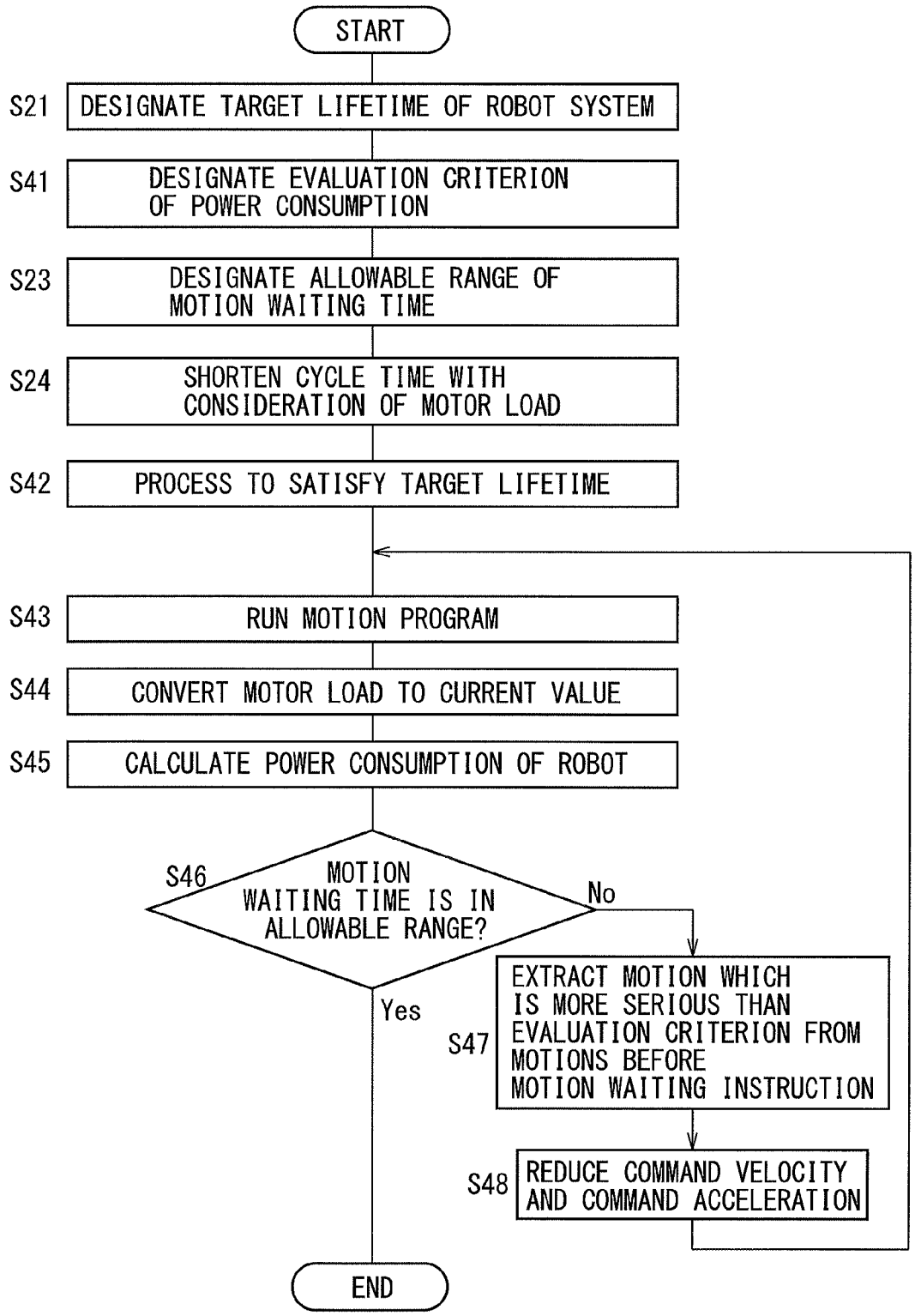

SIMULATION DEVICE FOR PLURAL ROBOTS

BACKGROUND OF THE INVENTION

1. Field of the Invention

The present invention relates to a simulation device which simulates the motion of a robot system including a plurality of robots in order to optimize a motion program.

2. Description of the Related Art

As a device for simulating the motion of a robot, a device in which a cycle time is minimized within an allowable range of a motor load while modifying a command velocity and a command acceleration by simulation is known (see, for example, Japanese Laid-Open Patent Application No. 2007-54942). Also known is a device in which the power consumption of a robot is estimated by simulation (see, for example, Japanese Laid-Open Patent Application No. 2011-5623).

When driving a plurality of robots simultaneously, it is preferred that the motion of a robot system including the plurality of robots is simulated in advance to construct an optimum program in which the robots do not interfere with each other and which allows for a plurality of evaluation criteria. However, both of the above-mentioned devices described in Japanese Laid-Open Patent Application No. 2007-54942 and Japanese Laid-Open Patent Application No. 2011-5623 simulate the motion of a single robot and do not simulate a plurality of robots.

SUMMARY OF THE INVENTION

According to one aspect of the present invention, provided is a simulation device which simulates motion of a robot system including a plurality of robots each including a drive shaft driven by a motor, including: a simulation unit which executes, by simulation, a motion program for each robot in which the robot is set in advance not to be interfered with one another and which is the motion program containing a command velocity and a command acceleration of the drive shaft, and a motion waiting instruction; a storage unit which stores in time series a line number of the motion program and the command velocity and the command acceleration at the line number associated with one another; an execution time calculation unit which calculates execution time of the motion program for each of the line numbers stored in the storage unit based on a simulation result obtained by the simulation unit; and a waiting time calculation unit which calculates motion waiting time in accordance with the motion waiting instruction based on the execution time calculated by the execution time calculation unit.

BRIEF DESCRIPTION OF THE DRAWINGS

The foregoing and other objects, features, and advantages of the invention will be more apparent from the following description of preferred embodiments taken in conjunction with the accompanying drawings in which:

FIG. 8 is a diagram illustrating simply a part of a motion program which is used for a simulation device of FIG. 6;

FIG. 10 is a flowchart illustrating one example of a process which is executed in an operation unit of FIG. 9.

DETAILED DESCRIPTION

First Embodiment

Figure 1:
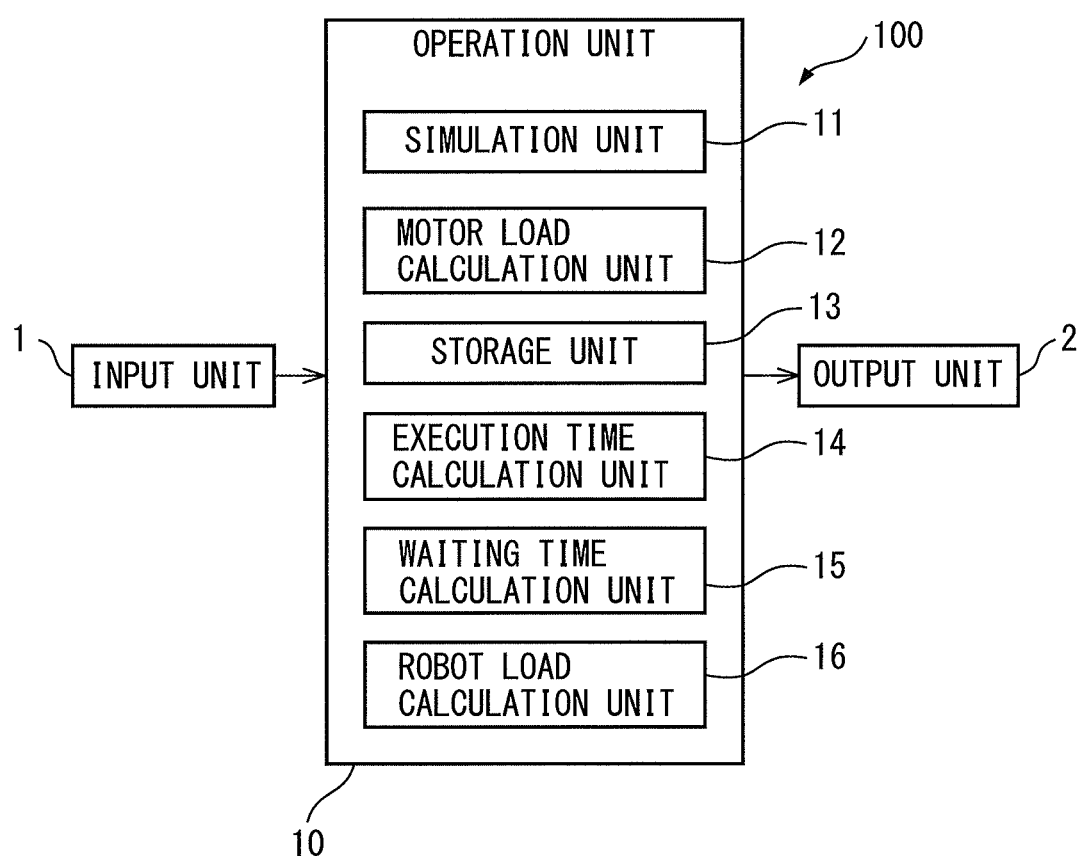
FIG. 1 is a block diagram illustrating the configuration of a simulation device according to a first embodiment of the present invention.

A first embodiment of the present invention will now be described with reference to FIGS. 1 to 3. FIG. 1 is a block diagram illustrating the configuration of a simulation device 100 according to the first embodiment of the present invention. The simulation device 100 simulates the motion of a robot system based on a motion program of a robot system including a plurality of robots. As illustrated in FIG. 1, the simulation device 100 includes an input unit 1, an output unit 2, and an operation unit 10.

The input unit 1 inputs a variety of command values contained in a motion program or the like, and is configured by a keyboard or the like. The output unit 2 displays a simulation result, and is configured by a display or the like. The operation unit 10 is configured by a computer including an arithmetic processing unit including CPU, ROM, RAM, and other peripheral circuits, and includes as functional components a simulation unit 11, a motor load calculation unit 12, a storage unit 13, an execution time calculation unit 14, a waiting time calculation unit 15, and a robot load calculation unit 16.

The simulation unit 11 simultaneously executes a plurality of motion programs (for example, programs PA, PB, PC in FIG. 2) corresponding to respective robots by simulation. A plurality of robots which are an object of simulation each includes a plurality of drive shafts, and each of the drive shafts is driven by a motor different from each other. The motion program includes a command velocity, a command acceleration, and a motion waiting instruction. The motion waiting instruction is a command which stops the motion of a robot. In other words, when a plurality of robots are operated simultaneously to perform a predetermined work (for example, assembly work), motion of each robot may be stopped at a predetermined timing in order to prevent interference between the robots, and a command at this time corresponds to the motion waiting instruction.

The motor load calculation unit 12 calculates a load (motor load) acting on each motor of each robot at every predetermined time based on a simulation result obtained by the simulation unit 11. Examples of the motor load include a motor torque and a motor speed. The motor torque can be calculated by a well-known arithmetic expression such as a Newton-Euler method.

The storage unit 13 stores in time series a motor load calculated by the motor load calculation unit 12, a command velocity and a command acceleration of a motor provided by a motion program, and each line number of the motion program associated with one another. FIG. 2 is a diagram illustrating one example of a motion program of a robot system. FIG. 2 illustrates motion programs PA, PB, and PC of three robots A, B, and C by comparison. The motion programs PA, PB, and PC of FIG. 2 includes a rotation command ("J_P . . . ") which rotates a drive shaft to a predetermined position, and a linear motion command ("L_P . . . ") which linearly moves a drive shaft to a predetermined position. The rotation command and the linear motion command are movement commands containing a command velocity and a command acceleration corresponding to a drive shaft, and a robot operates in accordance with the movement command.

"wait DI(2)=ON" and "wait DI(3)=ON" of the motion program PA of the robot A is a motion waiting instruction, and when the motion waiting instruction is output, the robot A stops motion for a certain time (in the figure, 1 second). A motion waiting instruction "wait DI(2)=ON" is output when a predetermined command "DO(2)=ON" is output from a motion program PB of the robot B, and a motion waiting instruction "wait DI(3)=ON" is output when a predetermined command "DO(3)=ON" is output from a motion program PC of the robot C. In a similar manner to the above, a motion waiting instruction "wait DI(2)=ON" of the robot B is output when a predetermined command "DO(2)=ON" is output from the motion program PA of the robot A, and a motion waiting instruction "wait DI(3)=ON" of the robot C is output when a predetermined command "DO(3)=ON" is output from a motion program PA of the robot A. By this, the robot B stops operating for a certain amount of time (in the figure, 2 seconds), and the robot C stops motion for a certain time (in the figure, 1.5 seconds). The motion waiting time of each of the robots A to C can be adjusted by changing the command velocity and the command acceleration.

The execution time calculation unit 14 calculates the execution time for each line number of the motion programs PA, PB, and PC stored in the storage unit 13 based on a simulation result obtained by the simulation unit 11. In other words, time required for executing a command for each line of the motion programs PA, PB, and PC is calculated for the whole motion program. Specifically, time required for executing the command on line 1, time required for executing the command on line 2, or the like of the motion program PA is calculated; time required for executing the command on line 1, time required for executing the command on line 2, or the like of the motion program PB is calculated; and time required for executing the command on line 1, time required for executing the command on line 2, or the like of the motion program PC is calculated.

The execution time calculation unit 14 also calculates time it takes for a robot system to execute a series of motions, i.e., the cycle time of a system. For example, assuming that the motion programs PA, PB, and PC are programs which are created for robots A, B, and C to cooperatively assemble a single part and that the motion programs PA, PB, and PC are executed repeatedly in order to repeatedly perform an assembly work for a single part, cycle time corresponds to time required for thoroughly completing the motion programs PA, PB, and PC. The cycle time can be calculated by adding execution time for each line of the motion programs PA, PB, and PC.

The waiting time calculation unit 15 extracts, among execution times calculated by the execution time calculation unit 14, execution time corresponding to a line number by which a motion waiting instruction is output as motion waiting time. For example, 1 second (execution time for "WAIT DI(2)=ON" and "WAIT DI(3)=ON") of the motion program PA, 2 seconds (execution time for "WAIT DI(2)=ON") of the motion program PB, and 1.5 seconds (execution time for "WAIT DI(3)=ON") of the motion program PC in FIG. 2 are extracted as motion waiting time. When an allowable range (for example, upper limit) of motion waiting time is set in advance by operation of the input unit 1, a value obtained by subtracting the upper limit of the allowable range from the execution time calculated by the execution time calculation unit 13 is calculated as motion waiting time.

The robot load calculation unit 16 calculates a load (robot load) acting on each robot in a series of motions of a robot system based on a motor load calculated by the motor load calculation unit 12 and a command velocity and a command acceleration of a motor provided by a motion program. Examples of the robot load include a degree of overheating of a motor, current limit value (OVC) for each motor, lifetime of a reducer which is provided between a motor and a drive shaft to reduce the rotation speed of the motor and to transmit the rotation to the drive shaft, a power which a robot consumes, and lifetime of a cable which is provided on a robot. A user can select in advance from the above as the robot load by operation of the input unit 1. The number of robot loads to be selected may be one or more.

Figure 3:
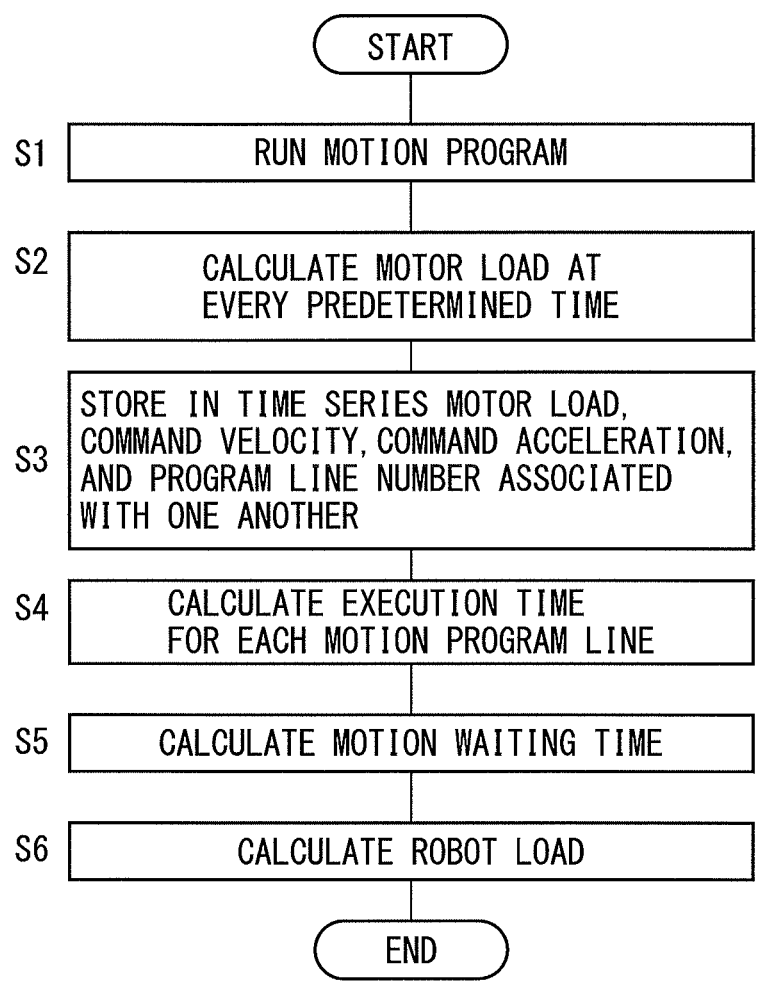
FIG. 3 is a flowchart illustrating one example of a process which is executed in an operation unit of FIG. 1.

FIG. 3 is a flowchart illustrating one example of a process which is executed in an operation unit 10 of FIG. 1. For example, the process illustrated in the flowchart is started when a simulation start command is input by operation of the input unit 1.

In step S1, motion programs PA, PB, and PC of robots A, B, and C of a robot system including a plurality of robots A, B, and C are executed by a process in a simulation unit 11.

In step S2, a load (for example, a motor torque and a motor speed) of each motor provided on each of the robots A, B, and C is calculated at every predetermined time based on a simulation result by a process in a motor load calculation unit 12.

In step S3, a motor load calculated by the motor load calculation unit 12, a command velocity and a command acceleration of a motor provided by the motion programs PA, PB, and PC, and each line number of the motion programs PA, PB, and PC are stored in time series in a memory associated with one another by a process in a storage unit 13.

In step S4, execution time of motion programs PA, PB, and PC for each line number stored in the storage unit 13 is calculated by a process in an execution time calculation unit 14 based on a simulation result obtained by the simulation unit 11, and at the same time, execution time for each line number is added to calculate a cycle time of a system.

In step S5, by a process in the waiting time calculation unit 15, an execution time corresponding to a line number by which a motion waiting instruction is output is extracted among execution times calculated by the execution time calculation unit 14 as motion waiting time, and the motion waiting time is output to an output unit 2. By this, a user can judge whether the motion waiting time is appropriate or not. When it is judged that the motion waiting time is not appropriate, the motion programs PA, PB, and PC can be optimized by changing the command velocity and the command acceleration of the motion programs PA, PB, and PC. For example, when it is judged that the motion waiting time is too long, a user operates the input unit 1 to reduce the command velocity and the command acceleration, thereby reducing the motion waiting time, by which an optimum motion program in which motion waiting time is small can be constructed.

In step S6, by a process in the robot load calculation unit 16, a robot load in a series of motions of a robot system is calculated based on a motor load calculated by the motor load calculation unit 12 and a command velocity and a command acceleration of a motor, and the robot load is output to the output unit 2. By this, a user can judge whether the robot load is appropriate or not. When it is judged that the robot load is not appropriate, the robot load can be optimized by changing the command velocity and the command acceleration of the motion programs PA, PB, and PC. For example, when reducer lifetime is selected as the robot load and it is judged that the reducer lifetime is small, a user operates the input unit 1 to reduce the velocity and the command acceleration to reduce a load acting on the reducer, and therefore the reducer lifetime can be prolonged.

According to the first embodiment, the following operational advantages can be attained.

(1) The simulation device 100 includes: a simulation unit 11 which executes, by simulation, motion programs PA, PB, and PC for robots A, B, and C in which the robots A, B, and C are set in advance not to be interfered with one another, i.e., motion programs containing a command velocity, a command acceleration, and a motion waiting instruction; a storage unit 13 which stores in time series a line number of the motion programs PA, PB, and PC and a command velocity and a command acceleration at the line number associated with one another; an execution time calculation unit 14 which calculates execution time of the motion programs PA, PB, and PC for each of the line numbers stored in the storage unit 13 based on a simulation result; and a waiting time calculation unit 15 which calculates motion waiting time in accordance with the motion waiting instruction based on the execution time. By this, motion programs PA, PB, and PC allowing for motion waiting time in a robot system including a plurality of robots A, B, and C can be created, thereby optimizing the motion programs.

(2) The simulation device 100 further includes: a motor load calculation unit 12 which calculates a motor load acting on motor at every predetermined time based on a simulation result obtained by the simulation unit 11; and a robot load calculation unit 16 which calculates a robot load acting on the robots A, B, and C. The storage unit 13 stores in time series a line number of the motion programs PA, PB, and PC, a command velocity and a command acceleration in the line number, and a motor load calculated by the motor load calculation unit 12 associated with one another, and the robot load calculation unit 16 calculates a robot load based on the stored motor load. By this, the motion programs PA, PB, and PC allowing for reducer lifetime or the like can be created, thereby optimizing the motion programs.

Second Embodiment

Figure 4:
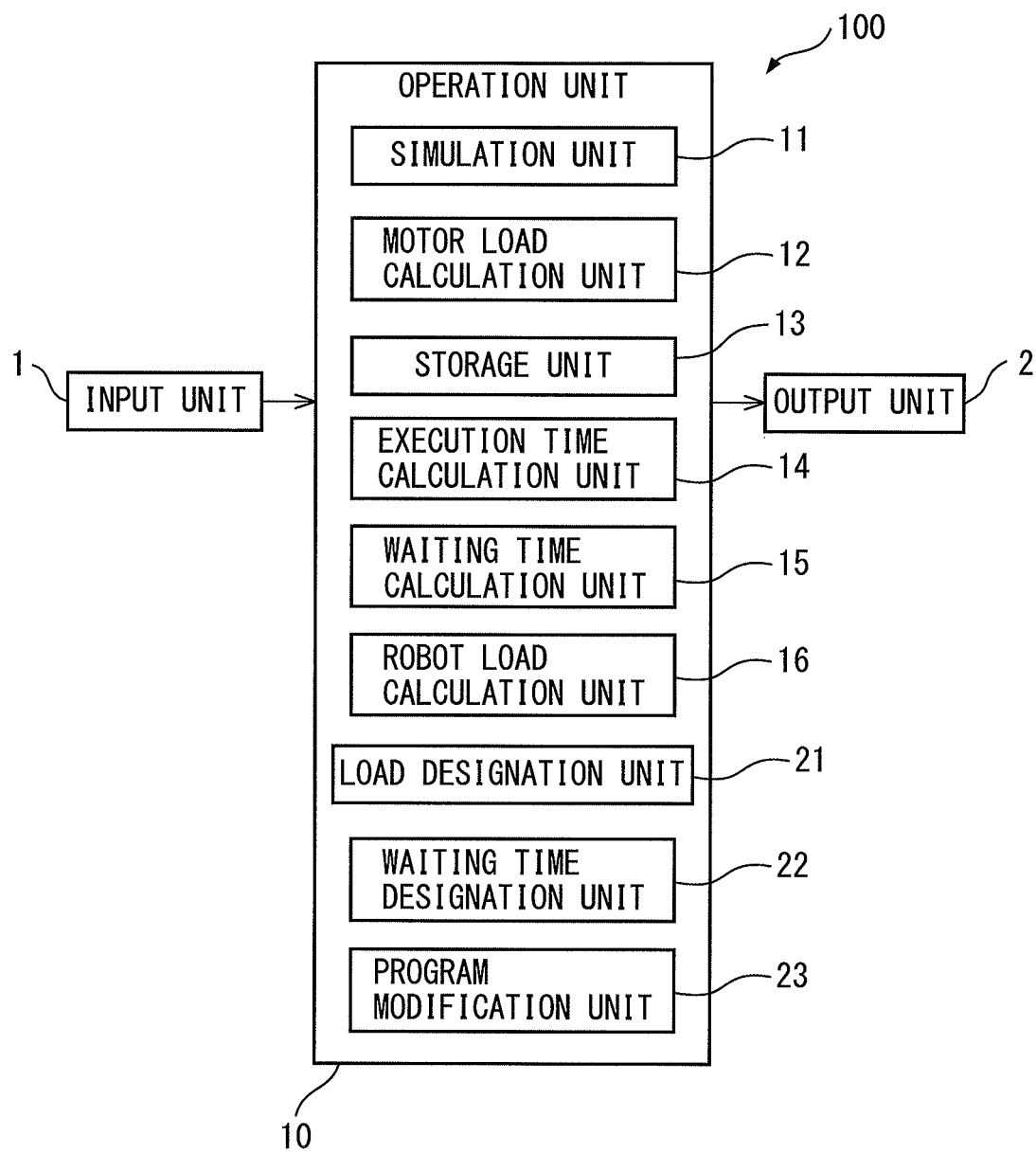
FIG. 4 is a block diagram illustrating the configuration of a simulation device according to a second embodiment of the present invention.

A second embodiment of the present invention will be described with reference to FIGS. 4 and 5. In the first embodiment, motion waiting time is optimized by user's own judgment, while in the second embodiment, motion waiting time is automatically optimized by the simulation device 100. FIG. 4 is a block diagram illustrating the configuration of a simulation device 100 according to the second embodiment of the present invention. In FIG. 4, the same reference signs are given to the same elements as those in FIG. 1, and the following description will be mainly made about differences from the first embodiment.

As illustrated in FIG. 4, the simulation device 100 according to the second embodiment includes a simulation unit 11, a motor load calculation unit 12, a storage unit 13, an execution time calculation unit 14, a waiting time calculation unit 15, and a robot load calculation unit 16, and further includes a load designation unit 21, a waiting time designation unit 22, and a program modification unit 23.

The load designation unit 21 designates an allowable range of a motor load. Specifically, any one of the degree of overheat of a motor, OVC, maximum current value which is allowed for a motor, maximum velocity, maximum acceleration, and maximum rate of change of acceleration (maximum jerk) is designated as the allowable range for a motor load. A user can select in advance which of the above to designate for the motor load by operation of the input unit 1. The number of motor loads to be selected may be one or more.

The waiting time designation unit 22 designates an allowable range of motion waiting time of the robots A, B, and C. The allowable range of motion waiting time is input in advance by operation of the input unit 1 by a user, and designated, for example, by an upper limit and a lower limit. Only one of the upper limit and the lower limit may be designated.

The program modification unit 23 modifies the command velocity and the command acceleration of the motion programs PA, PB, and PC such that the motor load stored in the storage unit 13 is in an allowable range of the motor load designated by the load designation unit 21 and that motion waiting time calculated by the waiting time calculation unit 15 is in an allowable range of motion waiting time designated by the waiting time designation unit 22. Further, the program modification unit 23 modifies the command velocity and the command acceleration such that the shortest cycle time of the robot system is obtained.

Figure 5:
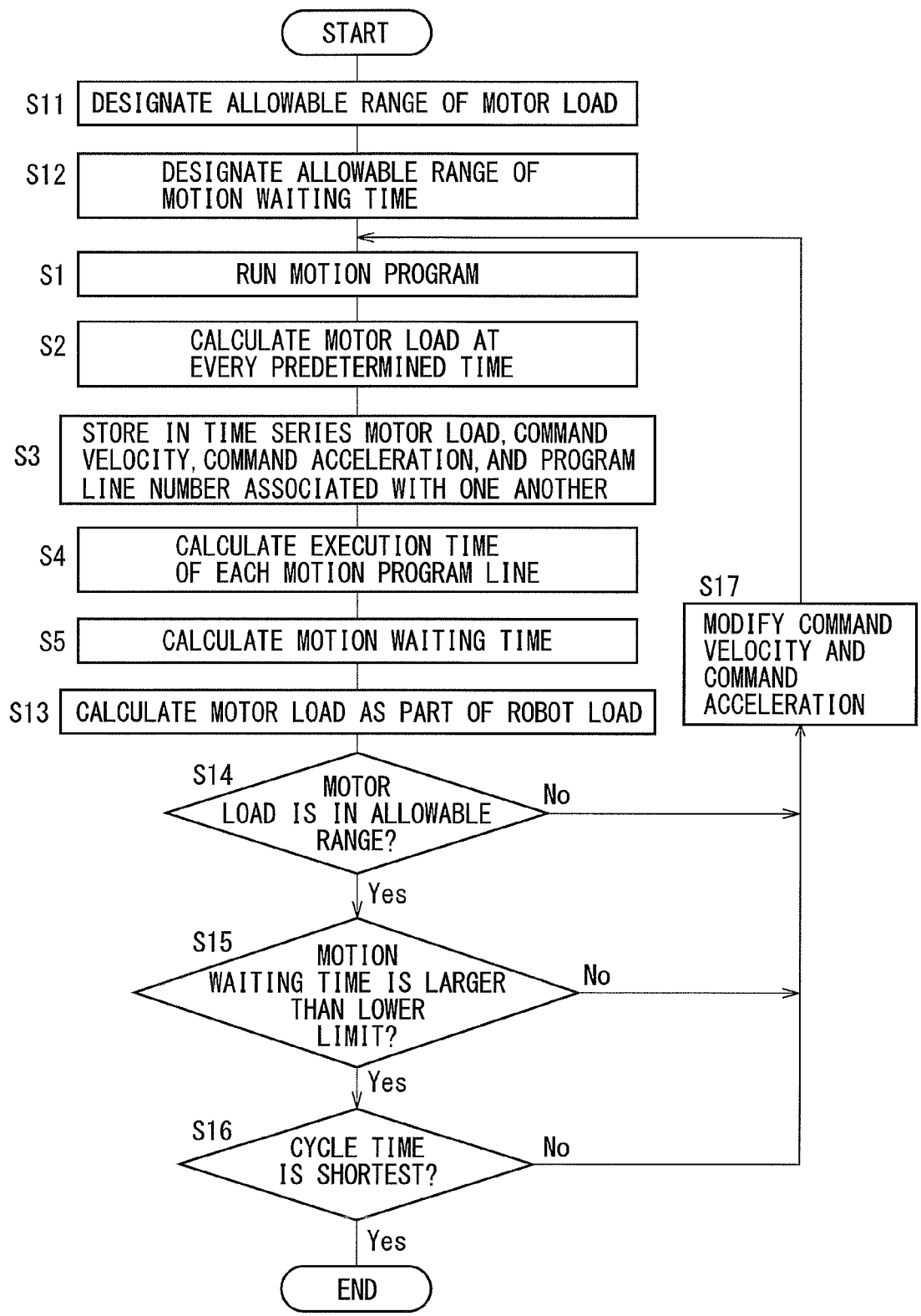
FIG. 5 is a flowchart illustrating one example of a process which is executed in an operation unit of FIG. 4.

FIG. 5 is a flowchart illustrating one example of a process which is executed in the operation unit 10 of FIG. 4. The same reference signs are given to the same processes as those in FIG. 3, and the following description will be mainly made about differences from the first embodiment. In step S11, an allowable range of a motor load is designated by a process in the load designation unit 21. In step S12, an allowable range (an upper limit and a lower limit) of motion waiting time is designated by a process in the waiting time designation unit 22. Then, a process similar to steps S1 to S5 of FIG. 3 is performed.

In step S13, a motor load corresponding to the designation of the load designation unit 21 is calculated by a process in the robot load calculation unit 16. In other words, the motor load calculated here is a motor load as a part of the robot load, and is different from a motor load (motor torque or velocity) calculated in step S2. For example, when an allowable range of overheat is designated in step S11, the degree of overheat of a motor is calculated in step S13.

In step S14, it is determined whether the motor load calculated in step S13 is in the allowable range designated in step S11 or not. When step S14 is affirmed, the process proceeds to step S15, and when step S14 is negated, the process proceeds to step S17.

In step S15, it is determined whether motion waiting time calculated in step S5 is larger than the lower limit of motion waiting time designated in step S12 or not. When step S15 is affirmed, the process proceeds to step S16, and when step S15 is negated, the process proceeds to step S17.

In step S16, it is determined whether cycle time of the robot system calculated by the execution time calculation unit 14 is the shortest or not. For example, the processes in steps S14 to S16 are repeated for a predetermined times (for example 10 times) and the shortest cycle time is stored. The stored cycle time and the calculated cycle time are compared with each other, and when the calculated cycle time is longer than the stored cycle time, step S16 is negated and the process proceeds to step S17. On the other hand, when the calculated cycle time is not longer than the stored cycle time, step S16 is affirmed to terminate the process.

In step S17, a command velocity and a command acceleration of motion program are modified such that all steps S14 to S16 are affirmed. Specifically, the command velocity and the command acceleration are modified such that a motor load is in an allowable range when step S14 is negated, that motion waiting time is in an allowable range when step S15 is negated, and that cycle time is the shortest when step S16 is negated. In step S17, not both of the command velocity and the command acceleration but one of the command velocity and the command acceleration may be modified.

The processes in the steps S14 to S17 are performed by processes in the program modification unit 23. When a process in step S17 is terminated, the process returns to step S1, and thereafter, a similar process is repeated until a motor load is in an allowable range, motion waiting time is in allowable range, and cycle time is the shortest. The repeating process in steps S1 to S17 is hereinafter referred to as a cycle time-shortened process allowing for a motor load.

The simulation device 100 according to the second embodiment can attain the following operational advantage in addition to a similar operational advantage to the simulation device 100 according to the first embodiment. Specifically, since the program modification unit 23 modifies the command velocity and the command acceleration such that the motion cycle time of a robot system calculated in step S4 is the shortest, an efficient work (for example, assembly work for a part) by the robot system is possible.

Modified Example

Figure 6:
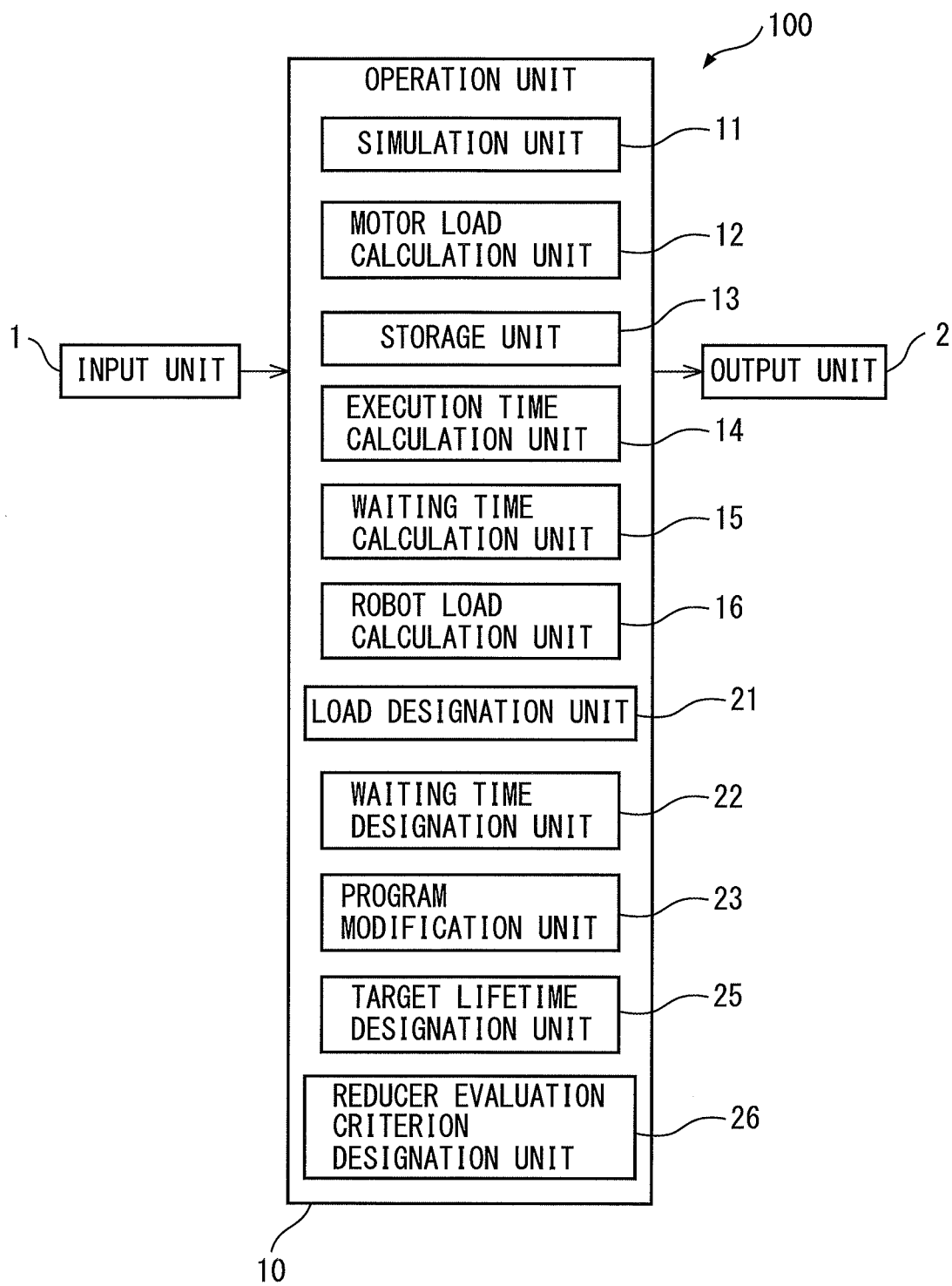
FIG. 6 is a diagram illustrating a modified example of FIG. 4.

FIG. 6 is a block diagram illustrating a modified Example of the simulation device 100 according to the second embodiment. The configuration of the simulation device 100 of FIG. 6 is particularly suitable when reducer lifetime is selected as a robot load in the process in the robot load calculation unit 16, and the simulation device 100 additionally includes a target lifetime designation unit 25 and a reducer evaluation criterion designation unit 26.

The target lifetime designation unit 25 designates a target lifetime of a robot system with reference to a reducer lifetime. The target lifetime in this case is designated by using operation time or cycle number of the robot system. A user can designate the target lifetime in advance by operation of the input unit 1.

The reducer evaluation criterion designation unit 26 designates a criterion (evaluation criterion) for evaluating reducer lifetime. The evaluation criteria are physical quantities which have an influence on reducer lifetime such as velocity, acceleration, torque, average torque, and the like of a motor, and one or a plurality of these are selected and the reference value thereof is designated. A user can select any of values in advance from the above as the evaluation criterion by operation of the input unit 1.

The program modification unit 23 modifies the command velocity and the command acceleration of motion program based on target lifetime designated by the target lifetime designation unit 25 and an evaluation criterion designated by the reducer evaluation criterion designation unit 26.

Figure 7:
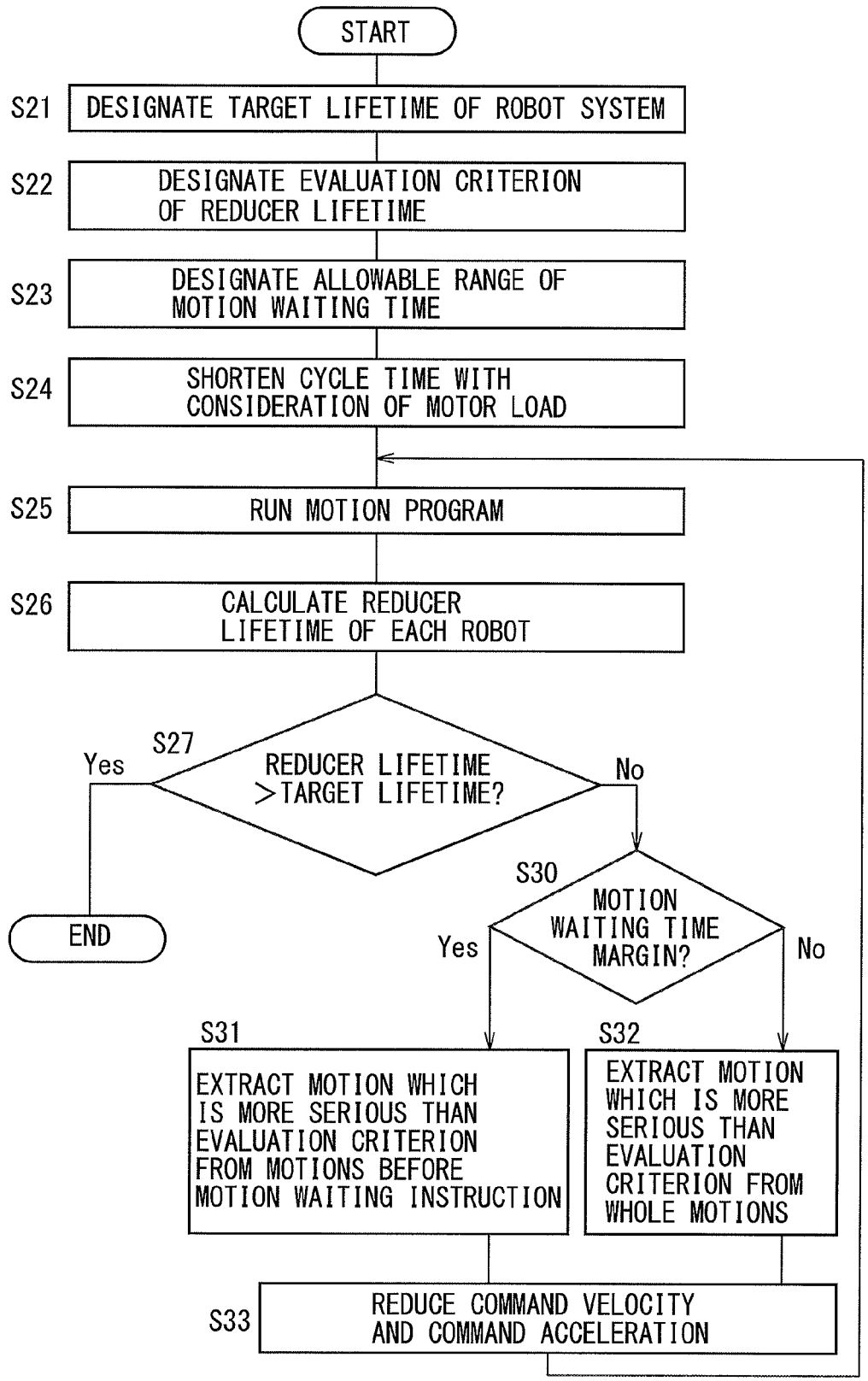
FIG. 7 is a flowchart illustrating one example of a process which is executed in an operation unit of FIG. 6.

FIG. 7 is a flowchart illustrating one example of a process which is executed in the operation unit 10 of FIG. 6. In step S21, target lifetime of a robot system with reference to reducer lifetime is designated by a process in the target lifetime designation unit 25. In step S22, an evaluation criterion of reducer lifetime is designated by a process in the reducer evaluation criterion designation unit 26. In step S23, an allowable range (an upper limit and a lower limit) of motion waiting time is designated by a process in the waiting time designation unit 22 in a similar manner to step S12 of FIG. 5.

In step S24, a similar process to those in steps S1 to S17 of FIG. 5, i.e., a cycle time-shortened process allowing for a motor load, is executed. In step S25, simulation is performed by a process in the simulation unit 11. In step S26, lifetime of a reducer provided on each drive shaft of each robot is calculated by a process in the robot load calculation unit 16.

In step S27, it is determined whether the reducer lifetime calculated in step S26 is longer than target lifetime designated in step S21 or not. When step S27 is affirmed, the process is terminated.

In step S30, it is determined whether there is motion waiting time margin as the result of simulation in step S25 or not. When step S30 is affirmed, the process proceeds to step S31, and when step S30 is negated, the process proceeds to step S32. The motion waiting time margin in step S30 is time between the motion waiting time and the lower limit of an allowable range. For example, when an allowable range is designated to 0.5 to 1.0 second in step S23 and motion waiting time of 0.5 seconds is obtained as the result of simulation, there is no motion waiting time margin from the allowable range (0.5 seconds). Therefore, in this case, the process proceeds to step S32. On the other hand, when motion waiting time of 0.8 seconds is obtained as the result of simulation, there is motion waiting time margin of 0.3 seconds from the allowable range (0.5 seconds). Accordingly, the process proceeds to step S31 in this case.

Figure 2:
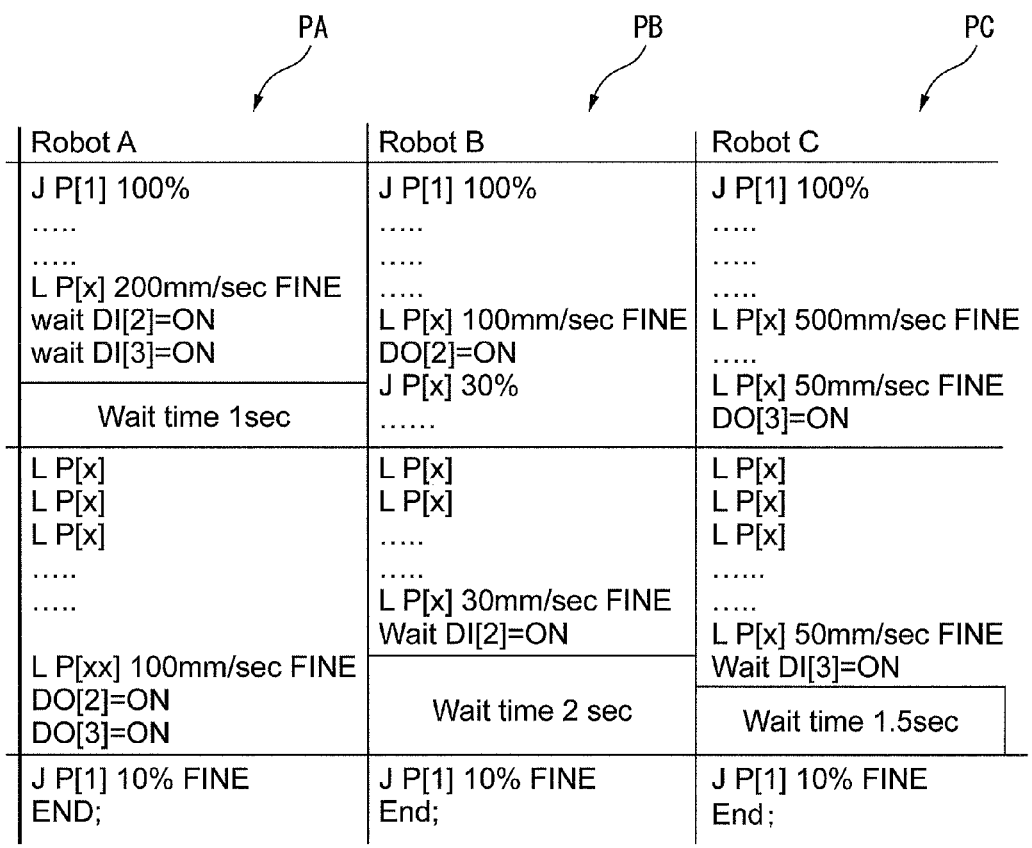
FIG. 2 is a diagram illustrating one example of a motion program which is used for the simulation device of FIG. 1.

In step S31, a motion which is more serious than an evaluation criterion and which is above the evaluation criterion designated in step S22 is extracted from the motions before a motion waiting instruction ("wait DI(2)=on" or the like in FIG. 2) is output. In this case, for example, as illustrated in FIG. 8 which is one example of a simplified motion program, there are a plurality of motion commands (motion instructions 1, 2, . . . , N) between a motion waiting instruction 1 and a motion waiting instruction 2, and when it is determined that there is motion waiting time in the motion waiting instruction 2, a motion above the evaluation criterion is extracted from the motion instructions 1 to N. A motion instruction 0 is not extracted.

Next, in step S33, the command velocity and the command acceleration of the extracted motion are reduced, and the process returns to step S25. By this, a motion which is more serious than an evaluation criterion by which reducer lifetime is adversely affected can be relaxed by utilizing motion waiting time. Therefore, in a repeating process, reducer lifetime can be made longer than a target lifetime.

In step S32, since there is no motion waiting time margin, a motion which is more serious than an evaluation criterion and which is above the evaluation criterion designated in step S22 is extracted from whole motion of the robot. Next, in step S33, the command velocity and the command acceleration of the extracted motion are reduced, and the process returns to step S25. By this, even when there is no motion waiting time margin, reducer lifetime can be made longer than a target lifetime by relaxing a motion which is more serious than the evaluation criterion.

The process of the program modification unit 23 is not restricted to the above as long as, in cases in which there is a robot whose reducer lifetime calculated by the robot load calculation unit 16 is shorter than a target lifetime designated by the target lifetime designation unit 25, when waiting time which is not shorter than a predetermined time is calculated by the waiting time calculation unit 15, a motion above an evaluation criterion designated by the reducer evaluation criterion designation unit 26 is extracted from motions before the waiting time is calculated to reduce the command velocity and the command acceleration in the extracted motion, while when waiting time which is not shorter than a predetermined time is not calculated by the waiting time calculation unit 15, a serious motion above an evaluation criterion designated by the reducer evaluation criterion designation unit 26 is extracted from the motion of a robot system to reduce the command velocity and the command acceleration in the extracted motion.

Figure 9:
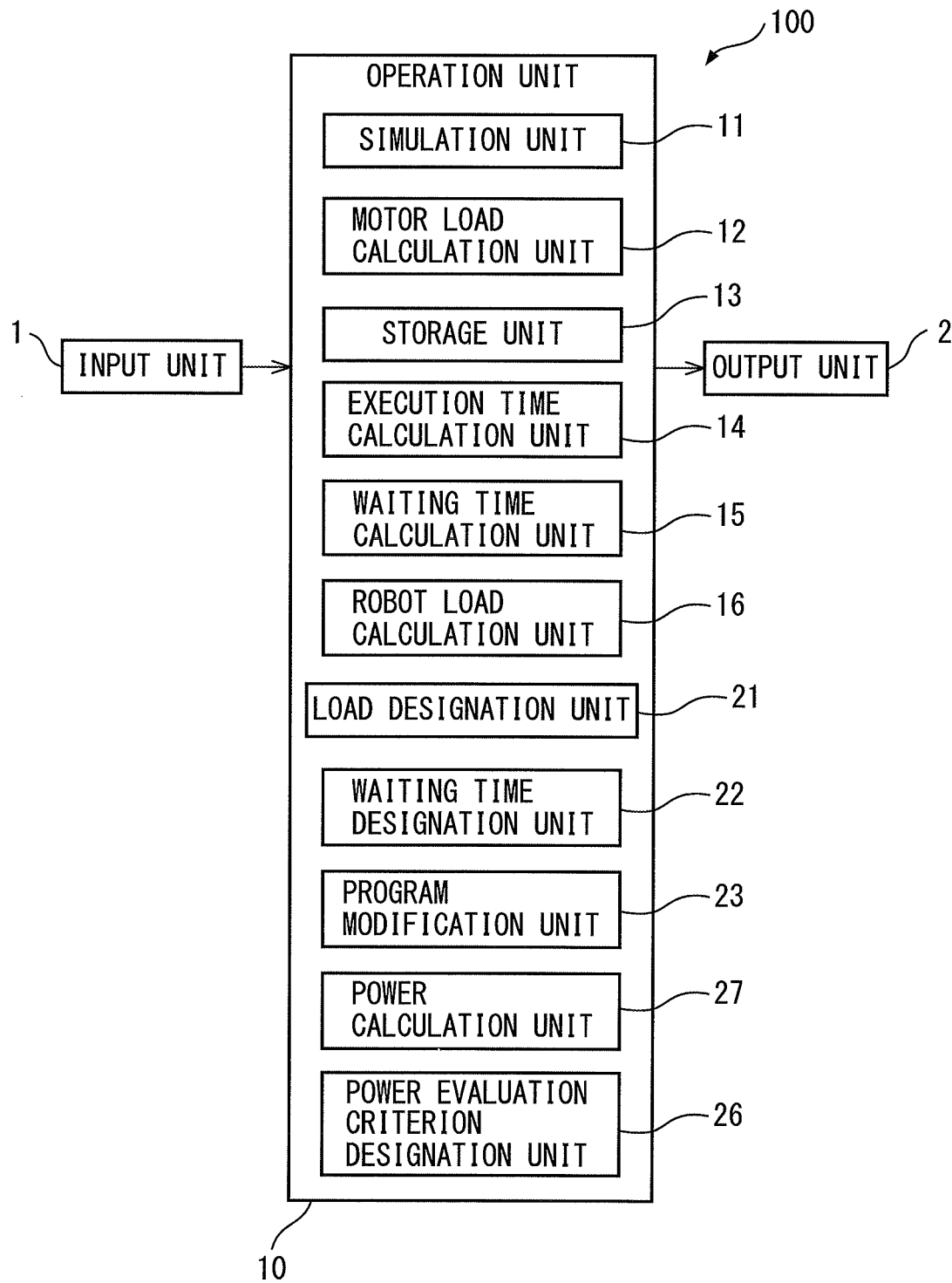
FIG. 9 is a diagram illustrating another modified example of FIG. 4.

FIG. 9 is a block diagram illustrating another modified Example of the simulation device 100 according to the second embodiment. The configuration of the simulation device 100 of FIG. 9 is particularly suitable when power consumption is selected as a robot load in the process in the robot load calculation unit 16, and the simulation device 100 additionally includes a power calculation unit 27 and a power evaluation criterion designation unit 28.

The power calculation unit 27 calculates power consumption of a robot. In this case, first, a motor load calculated by the motor load calculation unit 12 is converted to a current value. Next, power consumption is calculated by using the motor load, the command velocity, the command acceleration, and the converted current value.

The power evaluation criterion designation unit 28 designates an evaluation criterion of the power consumption of the robot. Examples of the evaluation criterion include average power consumption during each motion of each robot.

FIG. 10 is a flowchart illustrating one example of a process executed in the operation unit 10. In FIG. 10, a process such that reducer lifetime satisfied a target lifetime is also performed, and the same reference signs are given to the same processes as those in FIG. 7.

When a target lifetime (reducer lifetime) of a robot system is designated in step S21, an evaluation criterion of power consumption is designated by a process in the power evaluation criterion designation unit 28 in step S41. Next, an allowable range of motion waiting time is designated in step S23, a cycle time-shortened process allowing for a motor load is executed in step S24, and then, a process such that reducer lifetime satisfies a target lifetime is performed in step 42, for example, in a similar manner to steps S25 to S33 in FIG. 7. In this case, when step S27 of FIG. 7 is affirmed, the process proceeds to step S43.

In step S43, a motion program is executed, and in step S44, a motor load determined by a simulation result in step S43 is converted to a current value by a process in the power calculation unit 27. In step S45, power consumption of each robot is calculated by a process in the power calculation unit 27. In step S46, it is determined whether the motion waiting time determined by the simulation result of step S43 is in the allowable range designated in step S23 or not. In particular, it is determined whether the motion waiting time is above the upper limit of the allowable range or not. When step S46 is negated, the process proceeds to step S47, and when step S46 is affirmed, the process is terminated.

In step S47, a motion which is more serious than an evaluation criterion and which is above the evaluation criterion is extracted from motions before a motion waiting instruction is output. The evaluation criterion is an evaluation criterion of the power consumption designated in step S41, and in step S47, a motion in which the average power consumption is above the evaluation criterion is extracted. When it is determined whether power consumption of each robot is above the evaluation criterion or not before step S47, and it is determined that the power consumption of the robot is not above the evaluation criterion, the control may be terminated. In step S48, the command velocity and the command acceleration are reduced, and the process returns to step S43. By this, the power consumption of a robot system is reduced, and an optimum motion program in which cycle time is short, reducer lifetime is prolonged, and the power consumption is reduced can be created.

The process of the program modification unit 23 is not restricted to the above as long as, when waiting time not shorter than a predetermined time is calculated by the waiting time calculation unit 15, a motion above the evaluation criterion designated by the power evaluation criterion designation unit 28 is extracted from motions before the waiting time is calculated to reduce the command velocity and the command acceleration in the extracted motion.

Although, in the above-mentioned embodiment (FIG. 1), the simulation device 100 (operation unit 10) includes the simulation unit 11, the motor load calculation unit 12, the storage unit 13, the execution time calculation unit 14, the waiting time calculation unit 15, and the robot load calculation unit 16, a motion program allowing for motion waiting time can be created when the simulation device 100 at least includes the simulation unit 11, the storage unit 13, the execution time calculation unit 14, and the waiting time calculation unit 15. Therefore, the motor load calculation unit 12 and the robot load calculation unit 16 may be omitted from the simulation device 100. In the above-mentioned embodiment (FIG. 4), the command velocity and the command acceleration are modified by the program modification unit 23 such that the motor load stored in the storage unit 13 is in the allowable range of the motor load designated by the load designation unit 21, and the motion waiting time calculated by the waiting time calculation unit 15 is in the allowable range of the motion waiting time designated by the waiting time designation unit 22, and at the same time the command velocity and the command acceleration are modified such that motion cycle time of the robot system is the shortest. However, a process in which motion cycle time by the program modification unit 23 is made the shortest may be omitted. Although, in the above-mentioned modified Example (FIG. 6 and FIG. 9), a motion program allowing for reducer lifetime and power consumption is created, a motion program allowing for another robot load may be created.

According to the present invention, motion waiting time in accordance with a motion waiting instruction is calculated based on a simulation result of a motion program of each robot, and therefore, an optimum motion program allowing for motion waiting time can be constructed in a robot system including a plurality of robots.

The above description is strictly for illustration purposes, and the present invention is not limited to the above-mentioned embodiments and modified examples as long as the features of the present invention are not compromised. Components of the above-mentioned embodiment and modified examples include those which can be replaced and which are obviously replaced while maintaining identification of the invention. In other words, other embodiments which can be considered within the technical ideas of the present invention also fall within the scope of the present invention. The above-mentioned embodiment and at least one of the modified examples can be optionally combined.

The invention claimed is:

1. A simulation device which simulates motion of a robot system comprising a plurality of robots each comprising a drive shaft driven by a motor, the simulation device comprising:
    a simulation unit which executes, by simulation, a motion program for each robot in which each robot is set in advance so as not to interfere with one another, the motion program containing a command velocity and a command acceleration of the drive shaft, and a motion waiting instruction;
    a motor load calculation unit which calculates a motor load acting on the motor at every predetermined time based on a simulation result obtained by the simulation unit;
    a storage unit which stores in time series a line number of the motion program and the command velocity and the command acceleration at the line number associated with one another and further stores in time series the motor load further calculated by the motor load calculation unit associated with the line number;
    a robot load calculation unit which calculates a robot load acting on the robot based on the motor load stored in the storage unit;
    an execution time calculation unit which calculates an execution time of the motion program for each of the line numbers stored in the storage unit based on a simulation result obtained by the simulation unit;
    a waiting time calculation unit which calculates a motion waiting time in accordance with the motion waiting instruction based on the execution time calculated by the execution time calculation unit;
    a load designation unit which designates an allowable range of the motor load;
    a waiting time designation unit which designates an allowable range of the motion waiting time of the robot; and
    a program modification unit which modifies the command velocity and the command acceleration such that the motor load stored in the storage unit is in the allowable range of the motor load designated by the load designation unit and that the motion waiting time calculated by the waiting time calculation unit is in the allowable range of motion waiting time designated by the waiting time designation unit.

2. The simulation device according to claim 1, wherein the program modification unit modifies the command velocity and the command acceleration such that a motion cycle time of the robot system is the shortest.

3. The simulation device according to claim 1, further comprising:
    a target lifetime designation unit which designates a target lifetime of the robot system; and
    a reducer evaluation criterion designation unit which designates an evaluation criterion of lifetime of a reducer which reduces the rotation speed of the motor; wherein
    the robot load calculation unit calculates a reducer lifetime as the robot load, and
    the program modification unit, in cases in which there is a robot whose reducer lifetime calculated by the robot load calculation unit is shorter than the target lifetime designated by target lifetime designation unit when a waiting time which is not shorter than a predetermined time is calculated by the waiting time calculation unit, extracts a motion above the evaluation criterion designated by the reducer evaluation criterion designation unit from motions before the waiting time is calculated to reduce the command velocity and the command acceleration in an extracted motion; and when a waiting time which is not shorter than the predetermined time is not calculated by the waiting time calculation unit, extracts a serious motion above the evaluation criterion designated by the reducer evaluation criterion designation unit from the motion of a robot system to reduce the command velocity and the command acceleration in an extracted motion.

4. The simulation device according to claim 1, further comprising:
    a power calculation unit which calculates power consumption of the robot based on the motor load calculated by the motor load calculation unit and the command velocity; and
    a power evaluation criterion designation unit which designates an evaluation criterion of power consumption of the robot; wherein
    the program modification unit, when a waiting time not shorter than a predetermined time is calculated by the waiting time calculation unit, extracts a motion above the evaluation criterion designated by the power evaluation criterion designation unit from motions before the waiting time is calculated to reduce the command velocity and the command acceleration in an extracted motion.

* * * * *